(12) United States Patent
Lung

(10) Patent No.: US 7,772,581 B2
(45) Date of Patent: Aug. 10, 2010

(54) MEMORY DEVICE HAVING WIDE AREA PHASE CHANGE ELEMENT AND SMALL ELECTRODE CONTACT AREA

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 214 days.

(21) Appl. No.: 11/530,625

(22) Filed: Sep. 11, 2006

(65) Prior Publication Data

US 2008/0061341 A1  Mar. 13, 2008

(51) Int. Cl.
*H01L 29/04* (2006.01)

(52) U.S. Cl. .................. 257/3; 257/E45.002

(58) Field of Classification Search ........... 257/2, 257/4, 5, 30, E45.002, 295, 296, 1, 3; 438/3, 438/900
See application file for complete search history.

(56) References Cited

U.S. PATENT DOCUMENTS

| | | | |
|---|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,789,277 A | 8/1998 | Zahorik et al. |

(Continued)

FOREIGN PATENT DOCUMENTS

CN    1462478    12/2003

(Continued)

OTHER PUBLICATIONS

Ahn, S. J. et al., "Highly Reliable 5nm Contact Cell Technology for 256Mb PRAM," VLSI Technology, Digest of Technical Papers, Jun. 14-16, 2005, pp. 98-99.

(Continued)

*Primary Examiner*—W. David Coleman
*Assistant Examiner*—Latanya Crawford
(74) *Attorney, Agent, or Firm*—Haynes Beffel & Wolfeld LLP

(57) ABSTRACT

A memory cell device of the type that includes a memory material switchable between electrical property states by application of energy, situated between first and second ("bottom" and "top") electrodes has a top electrode including a larger body portion and a stem portion. The memory material is disposed as a layer over a bottom electrode layer, and a base of the stem portion of the top electrode is in electrical contact with a small area of the surface of the memory material. Methods for making the memory cell are described.

12 Claims, 8 Drawing Sheets

U.S. PATENT DOCUMENTS

| | | | |
|---|---|---|---|
| 5,789,758 | A | 8/1998 | Reinberg |
| 5,814,527 | A | 9/1998 | Wolstenholme et al. |
| 5,831,276 | A | 11/1998 | Gonzalez et al. |
| 5,837,564 | A | 11/1998 | Sandhu et al. |
| 5,869,843 | A | 2/1999 | Harshfield |
| 5,879,955 | A | 3/1999 | Gonzalez et al. |
| 5,902,704 | A | 5/1999 | Schoenborn et al. |
| 5,920,788 | A | 7/1999 | Reinberg |
| 5,933,365 | A | 8/1999 | Klersy et al. |
| 5,952,671 | A | 9/1999 | Reinberg et al. |
| 5,958,358 | A | 9/1999 | Tenne et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,066,870 | A | 5/2000 | Siek |
| 6,077,674 | A | 6/2000 | Schleifer et al. |
| 6,077,729 | A | 6/2000 | Harshfield |
| 6,087,269 | A | 7/2000 | Williams |
| 6,087,674 | A * | 7/2000 | Ovshinsky et al. .............. 257/2 |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,316,348 | B1 | 11/2001 | Fu et al. |
| 6,320,786 | B1 | 11/2001 | Chang et al. |
| 6,339,544 | B1 | 1/2002 | Chiang et al. |
| 6,351,406 | B1 | 2/2002 | Johnson et al. |
| 6,372,651 | B1 | 4/2002 | Yang et al. |
| 6,380,068 | B2 | 4/2002 | Jeng et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,440,837 | B1 | 8/2002 | Harshfield |
| 6,462,353 | B1 | 10/2002 | Gilgen |
| 6,483,736 | B2 | 11/2002 | Johnson et al. |
| 6,487,106 | B1 * | 11/2002 | Kozicki ...................... 365/153 |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,514,820 | B2 | 2/2003 | Ahn et al. |
| 6,534,781 | B2 | 3/2003 | Dennison |
| 6,545,903 | B1 | 4/2003 | Wu |
| 6,551,866 | B1 | 4/2003 | Maeda et al. |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,576,546 | B2 | 6/2003 | Gilbert |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,620,715 | B1 | 9/2003 | Blosse et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,674,115 | B2 | 1/2004 | Hudgens et al. |
| 6,744,088 | B1 | 6/2004 | Dennison |
| 6,746,892 | B2 | 6/2004 | Lee et al. |
| 6,750,079 | B2 | 6/2004 | Lowrey et al. |
| 6,791,102 | B2 | 9/2004 | Johnson et al. |
| 6,791,859 | B2 | 9/2004 | Hush |
| 6,797,979 | B2 | 9/2004 | Chiang et al. |
| 6,800,504 | B2 | 10/2004 | Li et al. |
| 6,800,563 | B2 | 10/2004 | Xu |
| 6,808,991 | B1 | 10/2004 | Tung et al. |
| 6,815,704 | B1 | 11/2004 | Chen |
| 6,830,952 | B2 | 12/2004 | Lung et al. |
| 6,850,432 | B2 | 2/2005 | Lu et al. |
| 6,859,389 | B2 | 2/2005 | Idehara et al. |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,304 | B2 | 5/2005 | Moore |
| 6,894,305 | B2 | 5/2005 | Yi et al. |
| 6,900,517 | B2 | 5/2005 | Tanaka et al. |
| 6,903,362 | B2 | 6/2005 | Wyeth et al. |
| 6,909,107 | B2 | 6/2005 | Rodgers et al. |
| 6,910,907 | B2 | 6/2005 | Layadi et al. |
| 6,927,410 | B2 | 8/2005 | Chen |
| 6,933,516 | B2 | 8/2005 | Xu |
| 6,936,544 | B2 | 8/2005 | Huang |
| 6,936,840 | B2 | 8/2005 | Sun et al. |
| 6,937,507 | B2 | 8/2005 | Chen |
| 6,943,365 | B2 | 9/2005 | Lowrey et al. |
| 6,969,866 | B1 | 11/2005 | Lowrey et al. |
| 6,972,428 | B2 | 12/2005 | Maimon |
| 6,972,430 | B2 | 12/2005 | Casagrande et al. |
| 6,992,932 | B2 | 1/2006 | Cohen |
| 7,023,009 | B2 | 4/2006 | Kostylev et al. |
| 7,033,856 | B2 | 4/2006 | Lung et al. |
| 7,042,001 | B2 | 5/2006 | Kim et al. |
| 7,067,864 | B2 | 6/2006 | Nishida et al. |
| 7,067,865 | B2 | 6/2006 | Lung et al. |
| 7,115,927 | B2 | 10/2006 | Hideki |
| 7,122,281 | B2 | 10/2006 | Pierrat |
| 7,122,824 | B2 | 10/2006 | Khouri et al. |
| 7,126,149 | B2 | 10/2006 | Iwasaki et al. |
| 7,132,675 | B2 | 11/2006 | Gilton |
| 7,151,273 | B2 * | 12/2006 | Campbell et al. .............. 257/3 |
| 7,164,147 | B2 | 1/2007 | Lee et al. |
| 7,166,533 | B2 | 1/2007 | Happ |
| 7,169,635 | B2 | 1/2007 | Kozicki |
| 7,214,958 | B2 | 5/2007 | Happ |
| 7,220,983 | B2 | 5/2007 | Lung |
| 7,277,317 | B2 | 10/2007 | Le Phan et al. |
| 7,291,556 | B2 | 11/2007 | Choi et al. |
| 7,314,776 | B2 * | 1/2008 | Johnson et al. ................ 438/95 |
| 7,323,708 | B2 | 1/2008 | Lee et al. |
| 7,351,648 | B2 | 4/2008 | Furukawa |
| 7,365,385 | B2 | 4/2008 | Abbott |
| 7,485,891 | B2 * | 2/2009 | Hamann et al. ................ 257/2 |
| 2002/0070457 | A1 | 6/2002 | Sun et al. |
| 2002/0113273 | A1 | 8/2002 | Hwang et al. |
| 2003/0116794 | A1 * | 6/2003 | Lowrey ...................... 257/296 |

| | | |
|---|---|---|
| 2004/0051094 A1 | 3/2004 | Ooishi |
| 2004/0248339 A1 | 12/2004 | Lung |
| 2005/0018526 A1 | 1/2005 | Lee |
| 2005/0029502 A1 | 2/2005 | Hudgens |
| 2005/0062087 A1 | 3/2005 | Chen et al. |
| 2005/0093022 A1 | 5/2005 | Lung |
| 2005/0127349 A1* | 6/2005 | Horak et al. ............... 257/3 |
| 2005/0167656 A1* | 8/2005 | Sun et al. ............... 257/30 |
| 2005/0191804 A1 | 9/2005 | Lai et al. |
| 2005/0201182 A1 | 9/2005 | Osada et al. |
| 2005/0212024 A1 | 9/2005 | Happ |
| 2005/0215009 A1 | 9/2005 | Cho |
| 2006/0038221 A1 | 2/2006 | Lee et al. |
| 2006/0073642 A1 | 4/2006 | Yeh et al. |
| 2006/0091476 A1 | 5/2006 | Pinnow et al. |
| 2006/0108667 A1 | 5/2006 | Lung |
| 2006/0110878 A1 | 5/2006 | Lung et al. |
| 2006/0110888 A1 | 5/2006 | Cho et al. |
| 2006/0118913 A1* | 6/2006 | Yi et al. ............... 257/613 |
| 2006/0154185 A1 | 7/2006 | Ho et al. |
| 2006/0175599 A1* | 8/2006 | Happ ............... 257/4 |
| 2006/0226409 A1* | 10/2006 | Burr et al. ............... 257/2 |
| 2006/0234138 A1 | 10/2006 | Fehlhaber et al. |
| 2006/0278895 A1* | 12/2006 | Burr et al. ............... 257/209 |
| 2006/0281216 A1 | 12/2006 | Chang et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0007613 A1* | 1/2007 | Wang et al. ............... 257/467 |
| 2007/0010054 A1 | 1/2007 | Fan et al. |
| 2007/0030721 A1 | 2/2007 | Segal et al. |
| 2007/0037101 A1 | 2/2007 | Morioka |
| 2007/0040159 A1* | 2/2007 | Wang ............... 257/3 |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1* | 5/2007 | Ahn et al. ............... 257/2 |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1* | 7/2007 | Lai et al. ............... 257/4 |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0224726 A1 | 9/2007 | Chen et al. |
| 2007/0235811 A1 | 10/2007 | Furukawa et al. |
| 2007/0246699 A1 | 10/2007 | Lung |
| 2007/0246748 A1* | 10/2007 | Breitwisch et al. ............... 257/246 |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0014676 A1 | 1/2008 | Lung et al. |

FOREIGN PATENT DOCUMENTS

| | | |
|---|---|---|
| WO | WO 00/45108 A1 | 8/2000 |
| WO | WO 00/79539 A1 | 12/2000 |
| WO | WO 01/45108 A1 | 6/2001 |

OTHER PUBLICATIONS

"Optimized Thermal Capacitance in a Phase Change Memory Cell Design", IPCOM000141986D, IP.com Prior Art Database, Oct. 18, 2006, 4 pp.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Lai, Stefan, "Current Status of the Phase Change Memory and Its Future," IEEE IEDM 2003, pp. 255-258.

Adler, David, "Amorphous-Semiconductor Devices," Sci. Amer., vol. 236, pp. 36-48, May 1977.

Adler, D. et al., "Threshold Switching in Chalcogenide-Glass Thin Films," J. Appl/ Phys 51(6), Jun. 1980, pp. 3289-3309.

Ahn, S.J. at al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. at al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl, Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al,, "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al, "Novel µTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Non-volatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n. Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol, 4, pp. 674-679, 2004.

Wuttig, Matthias, "Towards a Universal Memory?" Nature Materials, Apr. 2005, pp. 265-266, vol. 4.

Yi, J, H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

MEMORY DEVICE HAVING WIDE AREA PHASE CHANGE ELEMENT AND SMALL ELECTRODE CONTACT AREA

PARTIES TO A JOINT RESEARCH AGREEMENT

International Business Machines Corporation, a New York corporation, Macronix International Corporation, Ltd., a Taiwan corporation, and Infineon Technologies A.G., a German corporation, are parties to a Joint Research Agreement

BACKGROUND

1. Field of the Invention

This invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure

SUMMARY

Generally, the invention features a memory cell device of the type that includes a memory material switchable between electrical property states by application of energy, situated between first and second ("bottom" and "top") electrodes. In embodiments of a memory cell device of the invention, the top electrode includes a larger body portion and a stem portion. The memory material is disposed as a layer over a bottom electrode layer, and a base of the stem portion of the top electrode is in electrical contact with a small area of the surface of the memory material. The area of electrical contact is defined by the dimensions of the stem of the electrode, near the base, and not by the dimensions of the memory material, which can have a significantly greater area. The dimensions of the stem portion of the top electrode, and of the area of contact of the base of the stem with the memory material can according to the invention be made very small, and are not dependent upon masking technologies.

In one general aspect, the invention features a memory cell device including a bottom electrode, a memory material element over the bottom electrode, and a top electrode including a body portion and a stem portion, in which a base of the stem portion of the top electrode is in electrical contact with a small area of a surface of the memory material.

In another general aspect the invention features a method for making a memory cell device, by: forming a bottom electrode layer over a surface of a substrate; forming a memory material layer over the bottom electrode layer; forming a cap layer over the memory material layer; patterning the bottom electrode layer, the memory material layer and the cap layer to define a bottom electrode overlain by a memory element overlain by a cap; forming an intermetal dielectric fill layer over the memory material; forming an etch stop layer over the dielectric fill; forming a via through the etch stop layer and the dielectric fill to expose a surface of the cap, the via including an opening in the etch stop layer; removing a quantity of dielectric fill material from walls of the via, forming a cavity and resulting in an undercut beneath the margin of the opening in the etch stop layer; depositing a thermal isolation material in the cavity over the surface of the memory material, whereby a void is formed in the thermal isolation material; anisotropically etching the thermal isolation material and the cap to expose a small area of the surface of the memory material, forming a pore in the thermal isolation material and the cap adjacent the memory element and a wider cavity in the thermal isolation material; and depositing an electrode material in the pore and the wider cavity to form the top electrode.

According to the invention, a masking step establishes the openings in the silicon nitride layer over the memory cell vias. The remainder of the process is self-aligning, and highly repeatable. The area of contact between the top electrode and the memory material is determined by width of the stem portion of the top electrode, which in turn is determined by anisotropic etch conditions and by the size and shape of the void in the thermal insulator, which can be readily and repeatably controlled.

BRIEF DESCRIPTION OF THE DRAWINGS

FIG. 11B shows a programming current flow.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, features corresponding to features shown in other drawings are not all particularly renumbered, although they are all readily identifiable in all the FIGs.

Figure 1:
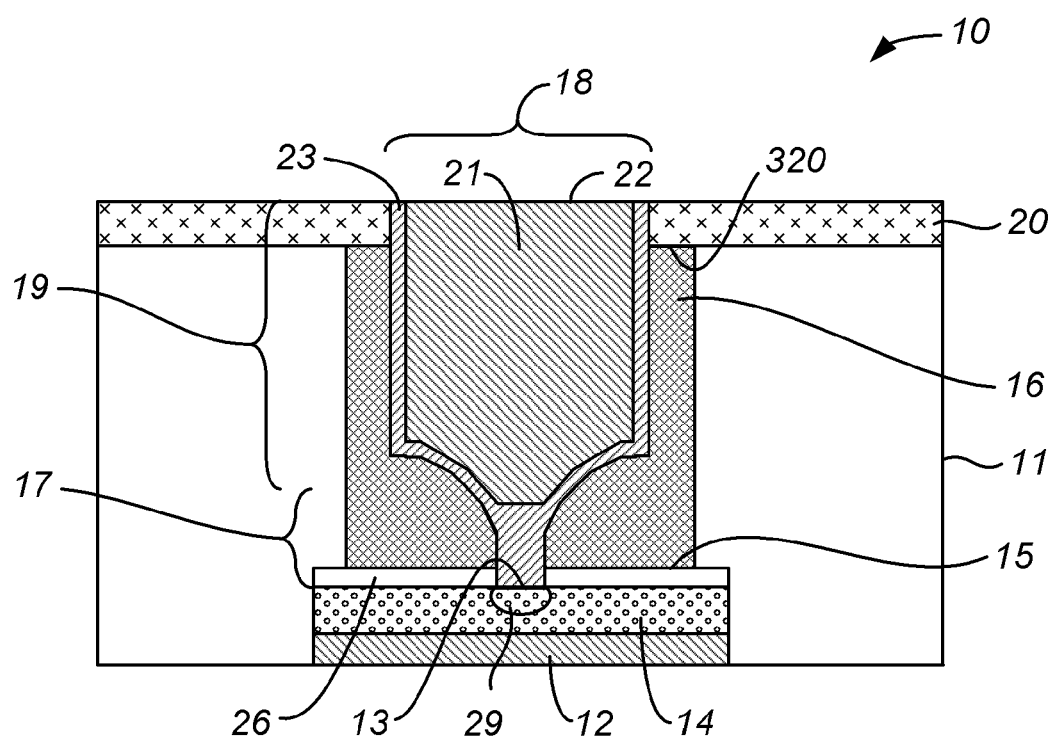
FIG. 1 is a diagrammatic sketch in a sectional view showing a memory cell device according to an embodiment of the invention.

Turning now to FIG. 1, there is shown generally at 10 a memory cell structure according to an embodiment of the invention. Memory cell structure 10 includes a bottom electrode 12 overlain by a memory element 14, a top electrode 18 including a body portion 19 and a stem portion 17. The stem portion 17 of the top electrode 18 is in contact with a small area 13 of the surface 15 of the memory material layer 14. The top electrode may optionally include a core portion 21 and a liner (heater) portion 23. The top electrode 18 is surrounded by a thermal isolation material 16. The top electrode and the surrounding thermal isolation material are formed within a via in an interlayer dielectric fill, or separation layer, 11, which is overlain by an electrically insulative layer 20.

The memory cell structure 10 is formed over a semiconductor substrate including access transistors, and electrical connection of the surface 22 of the top electrode 18 is made by way of patterned metallization, as described for example below with reference to FIG. 11A.

The conductive path in the memory cell passes from the surface 22 of the top electrode 18 through the top electrode body portion 19 and the top electrode stem portion 17 and then into the memory element 14 at the area of contact 13 of the base of the stem portion 17 with the surface of the memory element 14, then through the memory element to the bottom electrode 12.

This memory cell structure according to the invention provides several advantageous features. The top electrode is well isolated thermally from the surrounding dielectric fill. The area of contact of the top electrode with the memory material is small, so that the reset program current can be reduced. The area of contact between the top electrode and the memory material is determined by width of the stem portion of the top electrode, which in turn is determined by anisotropic etch conditions and by the size and shape of the void in the thermal insulator. The size of the void in the thermal insulator is determined by the width of an undercut 320 at the margin of the opening in the electrically insulative layer, which can be readily and repeatably controlled.

Embodiments of memory cell device 10 include phase change based memory materials, including chalcogenide based materials and other materials, for memory material 14. Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In the disclosure herein, the phase change material is referred to as GST, and it will be understood that other types of phase change materials can be used. A material useful for implementation of a memory device described herein is $Ge_2Sb_2Te_5$.

With reference again to FIG. 1, access circuitry, such as described with reference to FIG. 12, can be implemented to contact the first electrode 12 and the second electrode 18 in a variety of configurations for controlling the operation of the memory cell, so that it can be programmed to set the phase change material 14 in one of the two solid phases that can be reversibly implemented using the memory material. For example, using a chalcogenide-based phase change memory material, the memory cell may be set to a relatively high resistivity state in which at least a portion of the bridge in the current path is an amorphous state, and a relatively low resistivity state in which most of the bridge in the current path is in a crystalline state. For example, application of an electrical pulse having a suitable shorter, high amplitude profile, for example, results in changing the phase change material 14 locally to a generally amorphous state, as indicated at 29 in FIG. 1.

Manufacture of a memory cell device 10 will be described with reference to FIGS. 2-10, in which various stages in an exemplary process are shown in sectional view.

Figure 2:
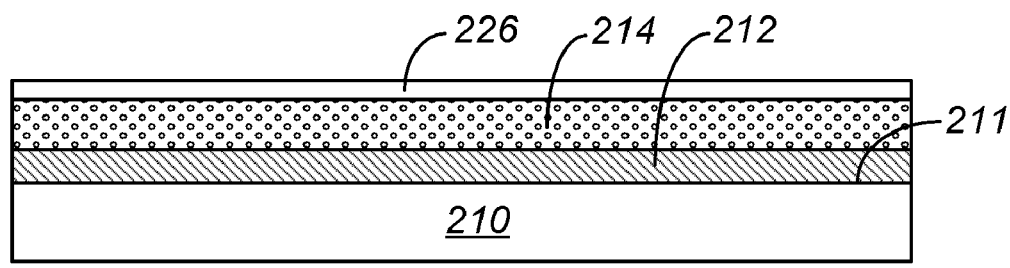
FIGS. 2-10 are sketches in a sectional view showing stages in a process for making a phase change memory cell according to an embodiment of the invention.

Referring to FIG. 2, a layer 212 of a material suitable as a bottom electrode is formed over a surface 211 of a substrate 210; a layer 214 of a phase change memory material is formed over the bottom electrode material layer 212; and a layer 226 of a protective cap material is formed over the layer 214 of phase change memory material.

The bottom electrode material layer 212 may be formed by a thin film deposition technique such as, for example, sputtering or atomic layer deposition onto surface 211 of the substrate 210. A suitable bottom electrode layer 212 may include layers of two or more materials, selected for their properties, among others, of adhesion to materials on adjacent layers. The bottom electrode layer 212 may include, for example, a film of titanium, followed by a film of titanium nitride on the surface of the titanium film. Titanium adheres well to materials in the underlying semiconductor substrate (such as a silicide); and titanium nitride adheres well to the overlying GST phase change material. Additionally, titanium nitride serves as a good diffusion barrier. A wide variety of materials can be used for the bottom electrode, including for example Ta, TaN, TiAlN, TaAlN; or the material of the bottom electrode may include one or more elements selected from the group consisting of Ti, W, Mo, Al, Ta, Cu, Pt, Ir, La, Ni and Ru, and alloys thereof; or may include a ceramic. The conditions of the deposition processes are established to provide suitable thickness of, and coverage by, the material(s) of the electrode layer, and to provide good thermal isolation. The bottom electrode at the surface of the substrate may have a thickness in a range about 200 nm to about 400 nm.

The layer 214 of phase change memory material may be formed over the bottom electrode layer 212 by a thin film deposition technique such as, for example, sputtering or atomic layer deposition. The conditions of the deposition processes are established to provide a suitable thickness of the phase change material layer over the bottom electrode. The phase change material layer at the surface of the bottom electrode over the substrate may have a thickness in a range about 20-200 nm.

The protective cap layer 226 protects the underlying phase change memory material during subsequent processes. Suitable materials for the protective cap layer 226 include, for example, silicon nitride, SiO$_2$, Al$_2$O$_3$, Ta$_2$O$_5$, and the layer may be formed by, for example a CVD or PVD process. The protective cap layer 226 may have a thickness in the range about 5 nm to about 50 nm. Formation of the bottom electrode layer, the phase change memory material layer, and the protective cap layer results in a structure as shown in FIG. 2

Figure 3:
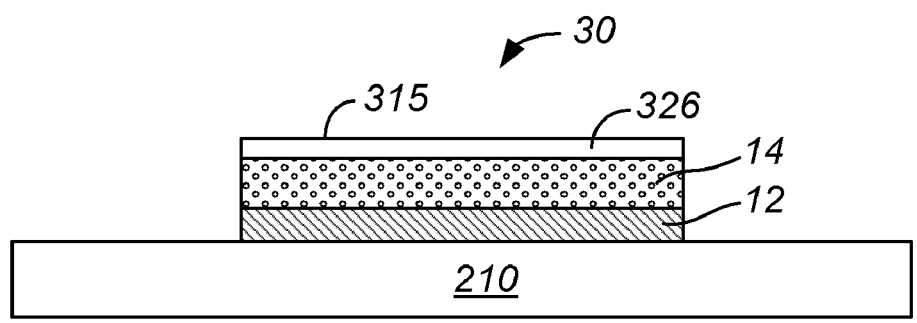

Then a mask and etch process is used to define a bottom electrode 12 overlain by a phase change material element 14 and a cap 326 approximately at the site 30 of the memory cell, resulting in a structure as shown in FIG. 3. The cap 326, which has a surface 315, protects the phase change material element during the mask and etch process and, particularly, in some embodiments, during removal (stripping) of the photoresist.

Figure 4:
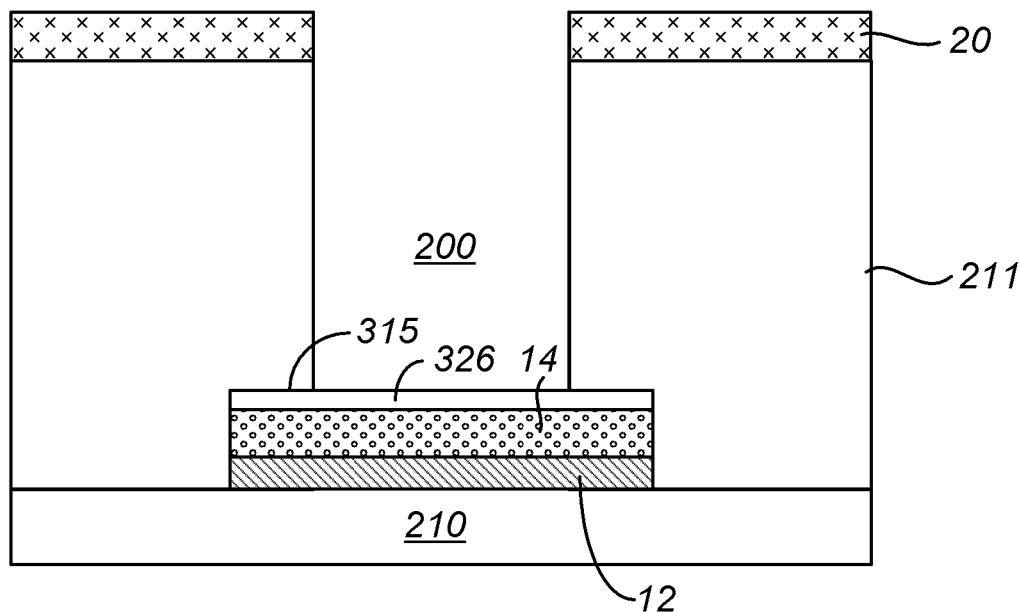
Figure 5:
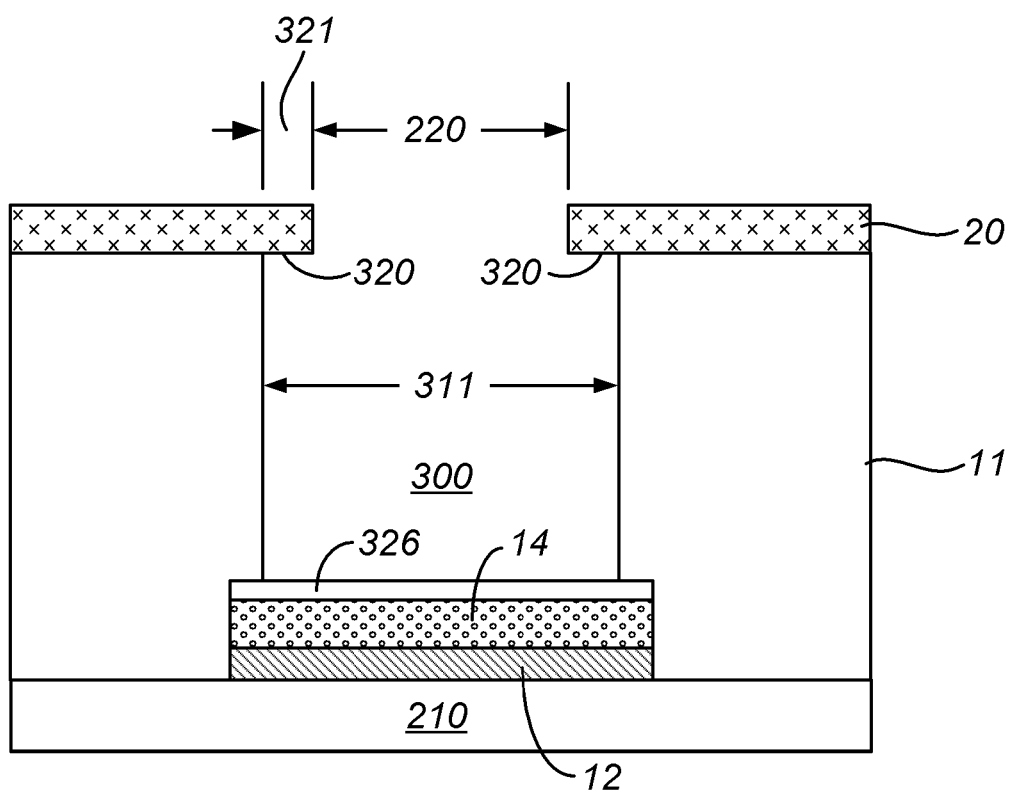

Then, an interlayer dielectric fill is formed over the surface of the substrate and over the patterned bottom electrode, memory element, and cap, and an etch stop layer is formed over the interlayer dielectric fill. The interlayer dielectric fill may include, for example, a low-K dielectric material such as silicon dioxide, silicon oxynitride, silicon nitride, Al$_2$O$_3$, or other low K dielectric. Alternatively, the material of the interlayer dielectric fill may include one or more elements selected from the group consisting of Si, Ti, Al, Ta, N, O, and C. The material of the etch stop layer may include, for example, silicon nitride. Vias are formed through the etch stop layer and the dielectric fill, using a mask and etch process. FIG. 4 shows a resulting memory cell via 200, formed through the etch stop layer 20, and the dielectric fill layer 211. The via reaches to the surface 315 of the cap 326 over the phase change material element 14. Then, a wet etch process, such as, for example, a hydrofluoric acid dip, is applied to undercut the dielectric fill material and to widen the cavity 300 in the dielectric fill 11, as shown in FIG. 5.

The dimensions of the completed memory cell will be determined in part by the dimensions of the memory cell via and, particularly, in part by the extent of the undercut, as described with reference particularly to FIGS. 6 and 7, below.

The interlayer dielectric fill may have a thickness in a range about 100 nm to about 300 nm, and the silicon nitride layer may have a thickness in a range about 10 nm to about 40 nm. The via 200 may have a width in a range about 30 nm to about 300 nm. The size of the opening 220 through the silicon nitride layer is established, within a variation (typically +/−about 20 nm for example), by the design rules for the particular lithographic process used to form the via 200. The diameter 220 of the opening in the silicon nitride layer may be generally circular, for example, with a diameter 220 about 200 nm +/−about 20 nm, for example. The material of the etch stop layer 20 is selected to be selectively etched relative to the dielectric fill material; that is, the wet etch process that removes the dielectric material to form the undercut 320 may have substantially no effect on the etch stop layer 20. Where silicon dioxide is the dielectric fill material, for example, silicon nitride provides a suitable material for the etch stop layer. The extent of the undercut can be controlled by timing the wet etch process, within a variation typically +/−about 1.5 nm, for example. The conditions of the wet etch are established to provide an undercut 320 having a width 321 in a range about 5 nm to about 50 nm beneath the margin in the opening of the silicon nitride layer, resulting in a width 311 of the cavity 300 about the sum of the width 220 of the opening in the silicon nitride layer plus 2 times the width 321 of the undercut 320.

The protective cap layer 326 may protect the underlying phase change memory element 14 during the etch process that forms the via 200, and during the wet etch process that widens the cavity 300 in the dielectric fill.

Figure 6:
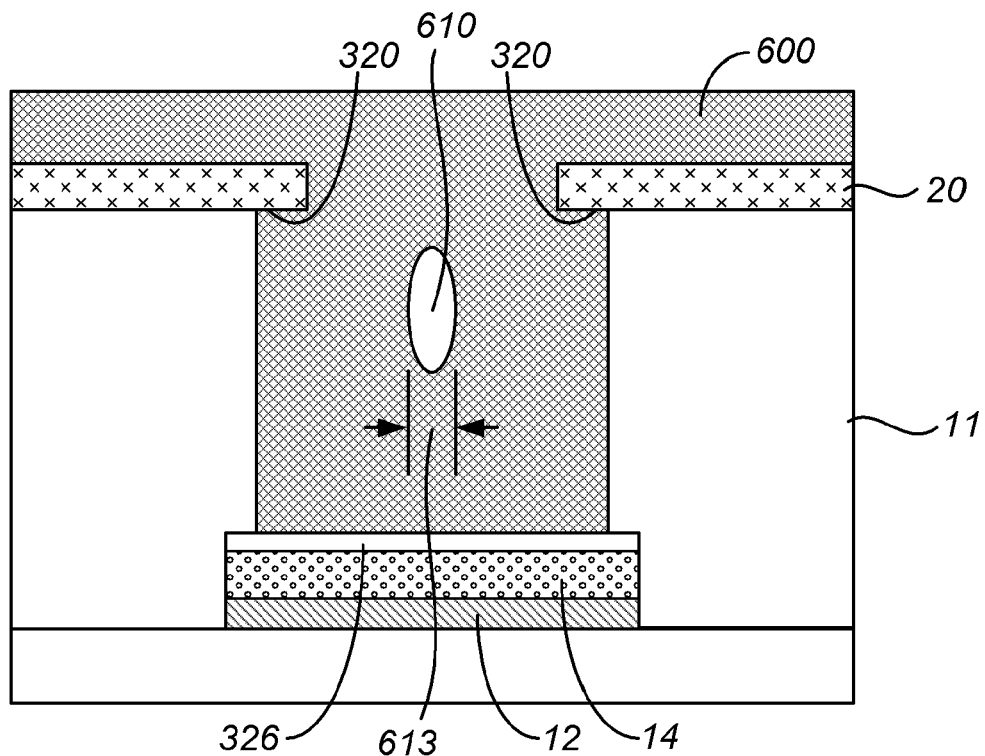
Figure 7:
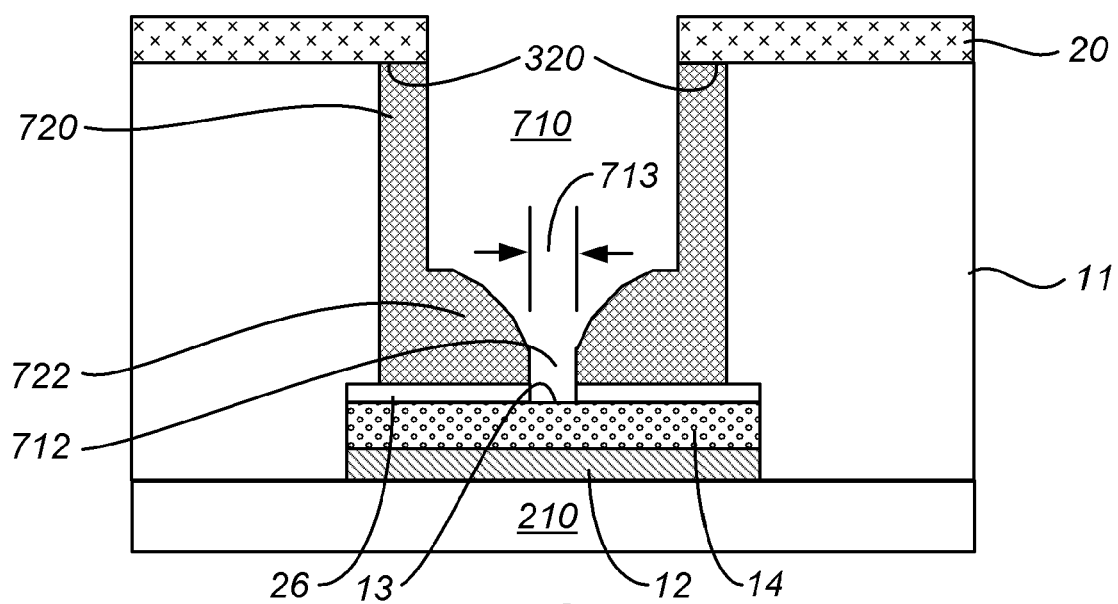

Then a suitable thermal isolation material is formed over the structure of FIG. 5, and within the via, using a conformational deposition process such as a chemical vapor deposition (CVD), resulting in a structure as shown FIG. 6. The geometry of the undercut, and the conditions of the deposition process, result in formation of a void 610 in the thermal isolation material 600. The void 610 is approximately centered within the cavity in the memory cell via. The shape and width 613 of the void (or diameter, where the void is generally round, for example circular) is related to the width of the undercut 320; for example, where the opening 220 in the etch stop layer 20 is generally circular, for example, the void can be expected to be generally circular, and can be expected to have a diameter 613 about two times the width of the undercut 321.

Suitable thermal isolation materials 600 include dielectric materials, and may be an oxide, such as a silicon dioxide, for example. Other thermal isolation materials may be preferred, and selection of a thermal isolation material depends in part on the material of the interlayer dielectric fill; particularly, thermal isolation material 600 is a better thermal insulator than the interlayer dielectric fill 11, preferably at least 10% better. Therefore, when the interlayer dielectric comprises silicon dioxide, the thermal insulator 600 preferably has a thermal conductivity value "kappa" less than that of silicon dioxide, which is 0.014 J/cm*K*sec. Representative materials for thermal insulator 600 include low permittivity (low-K) materials, including materials that are a combination of the elements silicon (Si), carbon (C), oxygen (O), fluorine (F), and hydrogen (H). Examples of thermally insulating materials which are candidates for use as thermal insulator 600 include SiCOH, polyimide, polyamide, and fluorocarbon polymers. Other examples of materials which are candidates for use for thermal insulator 600 include fluorinated $SiO_2$, silsesquioxane, polyarylene ethers, parylene, fluoropolymers, fluorinated amorphous carbon, diamond like carbon, porous silica, mesoporous silica, porous silsesquioxane, porous polyimide, and porous polyarylene ethers. A single layer or combination of layers can provide thermal insulation. In other preferred embodiments, the thermal insulator has a thermal conductivity less than that of the amorphous state of the phase change material, that is, less than about 0.003 J/cm*K*sec where the phase change material is a GST.

Then an anisotropic etch is performed, such as a reactive ion etch, to remove some of the thermal isolation material. The etch proceeds until an area of the surface of the cap 316 is exposed, and then proceeds until an area 13 of the surface 15 of the phase change element 14 is exposed. In some embodiments a first etch is performed under conditions that remove the thermal isolation material, and a second etch is performed under conditions that remove a portion of the cap (different etch chemistries may be used, for example). FIG. 7 shows a resulting structure. All the thermal isolation material overlying the etch stop layer 20 has been removed; and some of the thermal isolation material has been removed from the cavity in the memory cell via forming a pore 712 near the surface of the phase change material, which will define the stem portion of the top electrode; and a wider cavity 710, which will define the body portion of the top electrode The undercut 320 protects the thermal isolation material beneath it, leaving a residual portion 720 adjacent the wall of the cavity and adjacent the portion of the phase change material next to the wall of the cavity. The etch is stopped when a small area 13 of the surface of the phase change material is exposed at the bottom of the pore 712; a residual portion 722 remains after the etch is stopped, and this defines the shape and dimensions of the pore 712. The dimensions of the stem portion of the top electrode—and, consequently, the area of the contact of the top electrode with the phase change material—are determined in part by the position and the size of the void and by the deposition conformality of the thermal insulator material 600. Particularly, the width of the exposed small area 13 (diameter, if the area is circular, for example) of the phase change material 14 exposed at the bottom of the pore 712 results from the shape and width 713 of the pore 712, which in turn results from the shape and size of the void, as well as from the conditions of the etch. As noted above, the width (or diameter) of the void relates to the width of the undercut, and is not dependent upon the width of the via; typically the width of the void is about twice the width of the undercut. The position of the void (and, consequently, the position of the pore 712) is approximately at the center of the via and, because the memory material element has a significantly greater area, it is not necessary for the via to be precisely aligned with the memory material element.

The exposed small area 13 need not have any particular shape; it may, for example, be generally round (e.g., circular) or it may have some other shape, or it may have an irregular shape. Where the small area is circular, for example, the small area 13 may have a diameter in a range about 10 nm to about 100 nm, such as about 20 nm to about 50 nm, for example about 30 nm. Under conditions described herein, these dimensions may be expected where the width of the undercut is in a range about 5 nm to about 50 nm, such as about 10 nm to about 25 nm, for example about 15 nm.

Figure 8:
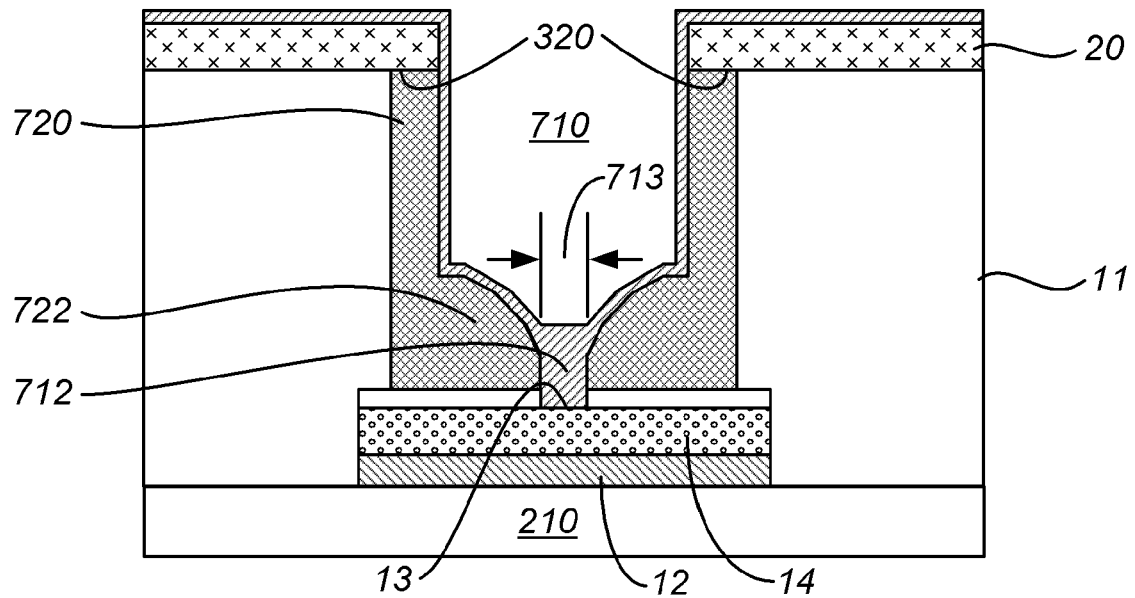
Figure 9:
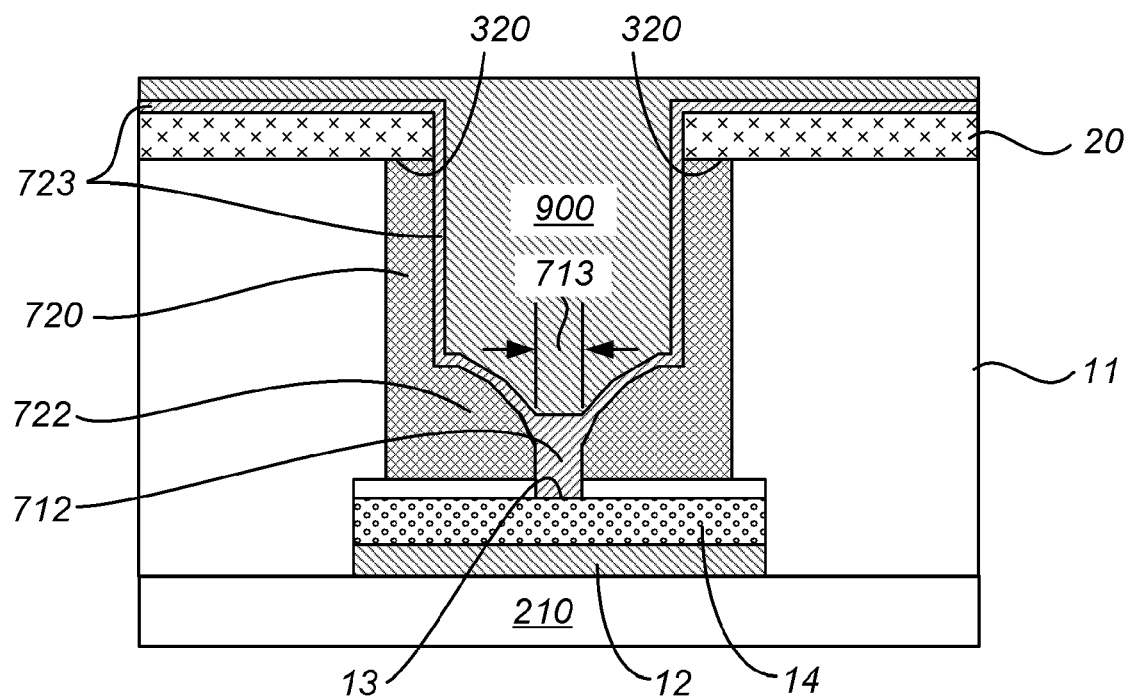

Then the top electrode is formed in the memory cell cavity. In embodiments as shown in the FIGs., the top electrode includes a core surrounded by a liner (heater). In such embodiments, the liner is formed by depositing a suitable liner material over the structure of FIG. 7, resulting in a structure as shown in FIG. 8. The liner material fills the pore 712, forming the stem portion 17 of the top electrode; and forms a film 723 over the other surfaces of the structure. Suitable liner materials include, for example, tantalum nitride, titanium nitride, tungsten nitride, TiW. The conditions of the deposition processes are established to provide suitable thickness of, and coverage by, the material(s) of the electrode layer. Then the core of the top electrode is formed by depositing a suitable electrode material within the cavity and over the structure of FIG. 7, as shown at 900 in FIG. 9. The core material may be deposited by, for example, chemical vapor deposition (CVD). The top electrode 900 may be, for example, tungsten. Other suitable top electrode core materials include, for example, other metals such as copper, platinum, ruthenium, iridium, and alloys thereof.

A wide variety of materials can be used for the top electrode, including for example Ta, TaN, TiAlN, TaAlN; or the material of the top electrode may include one or more elements selected from the group consisting of Ti, W, Mo, Al, Ta, Cu, Pt, Ir, La, Ni and Ru, and alloys thereof; or may include a ceramic.

Figure 10:
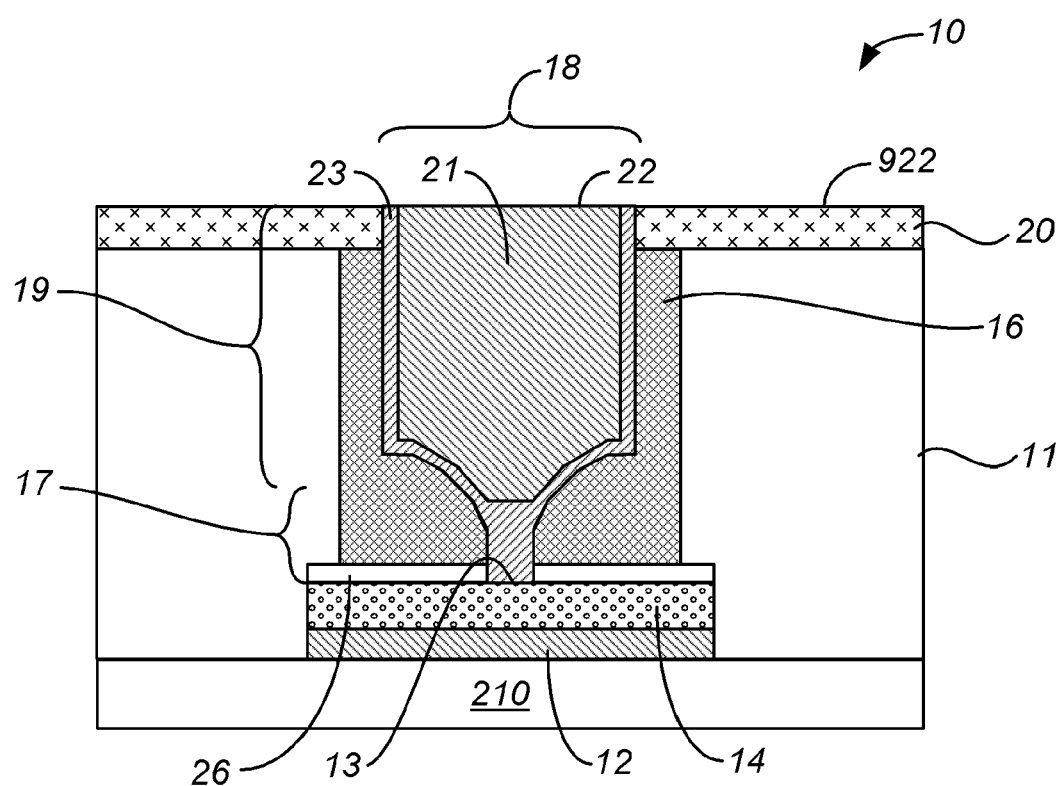

Then a planarizing process is used to remove the upper material, down to the surface 922 of the silicon nitride layer 20, resulting in a completed memory cell structure as shown in FIG. 10.

Figure 11A:
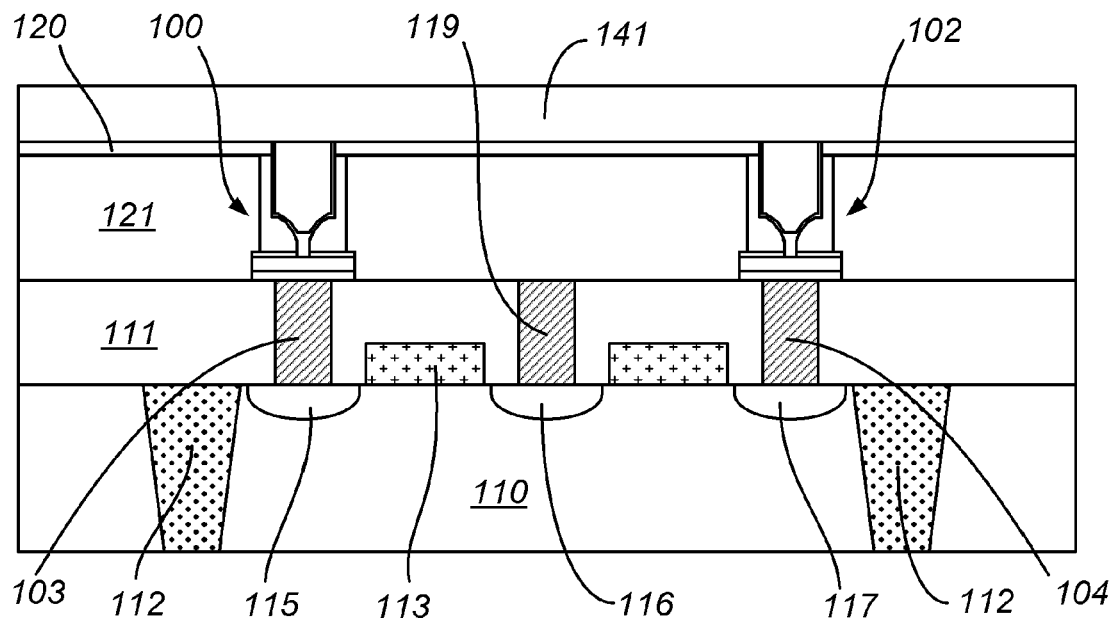
FIGS. 11A and 11B are sketches in a sectional view showing a portion of a memory array according to an embodiment of the invention.

FIG. 11A shows a sectional view of two phase change random access memory cells 100, 102 according to the invention. The cells 110, 102 are formed on a semiconductor substrate 110. Isolation structures such as shallow trench isolation ("STI") dielectric trenches 112 isolate pairs of rows of memory cell access transistors in the substrate. The access transistors are formed by common source region 116 in the substrate 110, and drain regions 115 and 117 in the substrate 112. Polysilicon word lines 113 and 114 constitute the gates of the access transistors. Common source line 119 is formed over the source region 116. A first dielectric fill layer 111 is deposited over the polysilicon word lines and the common source line on the substrate 110. Contact plugs 103, 104 (e.g., tungsten) are formed in vias in the fill layer 111 over the drain regions. Memory cells 100, 102 are formed, generally as described above with reference to FIGS. 2-10, and the memory cells 101, 102 are structured generally each like memory cell 10 as described with reference to FIG. 1: a bottom electrode material layer is deposited over the first dielectric fill layer, a memory material layer is deposited over the bottom electrode material layer, and a protective cap material layer is deposited over the memory material layer; the layers are patterned to form bottom electrode in contact with the contact plug, memory elements over the bottom electrode, and a cap over the memory element; a second dielectric fill layer 121 is deposited over these structures, an etch stop layer 120 is deposited over the second dielectric fill layer, and the etch stop layer and second dielectric fill are masked and etched to form vias and then wet etched to form cavities with undercuts beneath the margins of the via openings in the etch stop layer; then the thermal isolation material is deposited in the cavities (forming voids), anisotropic etch is formed through the thermal isolation material and the cap to form a cavity and to expose a small area of the surface of the memory element; the top electrode is formed in the cavity; the upper surface of the structure is planarized, and bit line 141 is formed over the memory cells, in contact with the upper surfaces of the top electrodes.

Figure 11B:
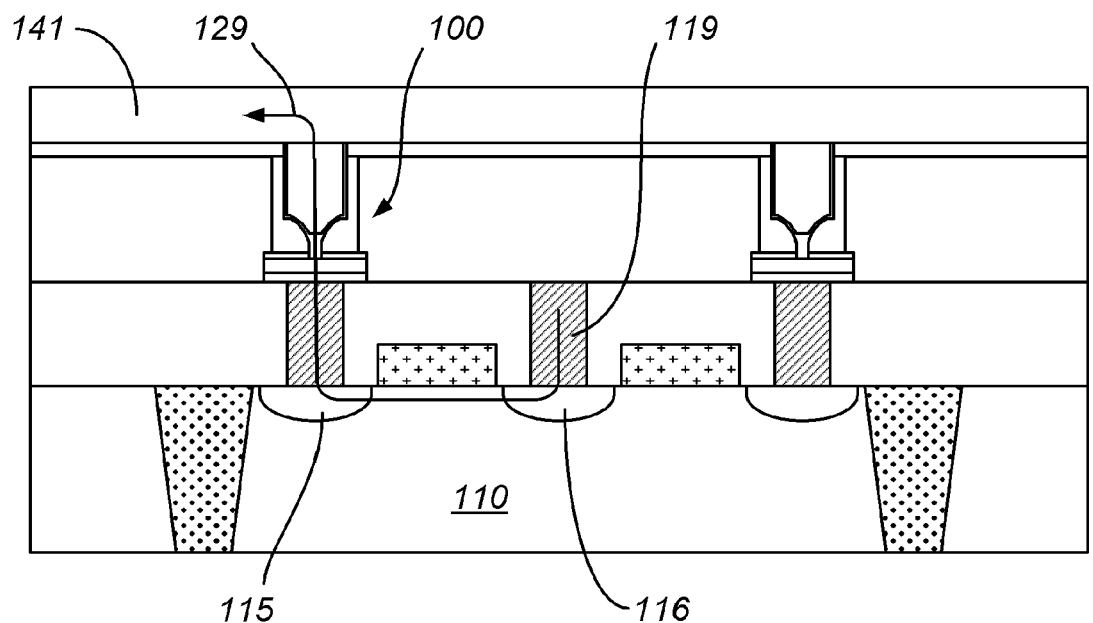

FIG. 11B shows a programming current path (arrow 129) through memory cells according to the invention, as described with reference to FIGS. 1 and 11A. The current flows from the M1 common source line 119 to the source region 116, then to the drain region 115, and from the drain region 115 through the contact plug 103 to the memory cell 100 and through the memory cell 100 to the bit line 141.

Figure 12:
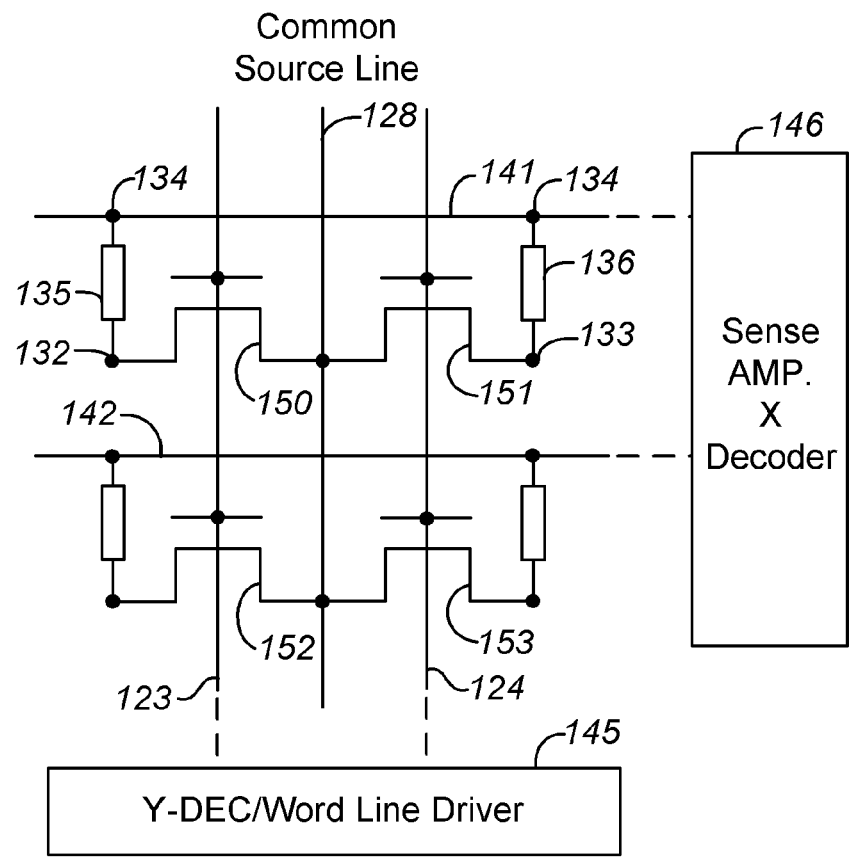
FIG. 12 is a schematic diagram for a memory array having phase change memory elements.

FIG. 12 is a schematic illustration of a memory array, which can be implemented as described herein. In the schematic illustration of FIG. 2, a common source line 128, a word line 123 and a word line 124 are arranged generally parallel in the Y-direction. Bit lines 141 and 142 are arranged generally parallel in the X-direction. Thus, a Y-decoder and a word line driver in block 145 are coupled to the word lines 123, 124. An X-decoder and a set of sense amplifiers in block 146 are coupled to the bit lines 141 and 142. The common source line 128 is coupled to the source terminals of access transistors 150, 151, 152 and 153. The gate of access transistor 150 is coupled to the word line 123. The gate of access transistor 151 is coupled to the word line 124. The gate of access transistor 152 is coupled to the word line 123. The gate of access transistor 153 is coupled to the word line 124. The drain of access transistor 150 is coupled to the bottom electrode member 132 for memory cell 135, which has top electrode member 134. The top electrode member 134 is coupled to the bit line 141. Likewise, the drain of access transistor 151 is coupled to the bottom electrode member 133 for memory cell 136, which has top electrode member 137. The top electrode member 137 is coupled to the bit line 141. Access transistors 152 and 153 are coupled to corresponding memory cells as well on bit line 142. It can be seen that in this illustrative configuration the common source line 128 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 13:
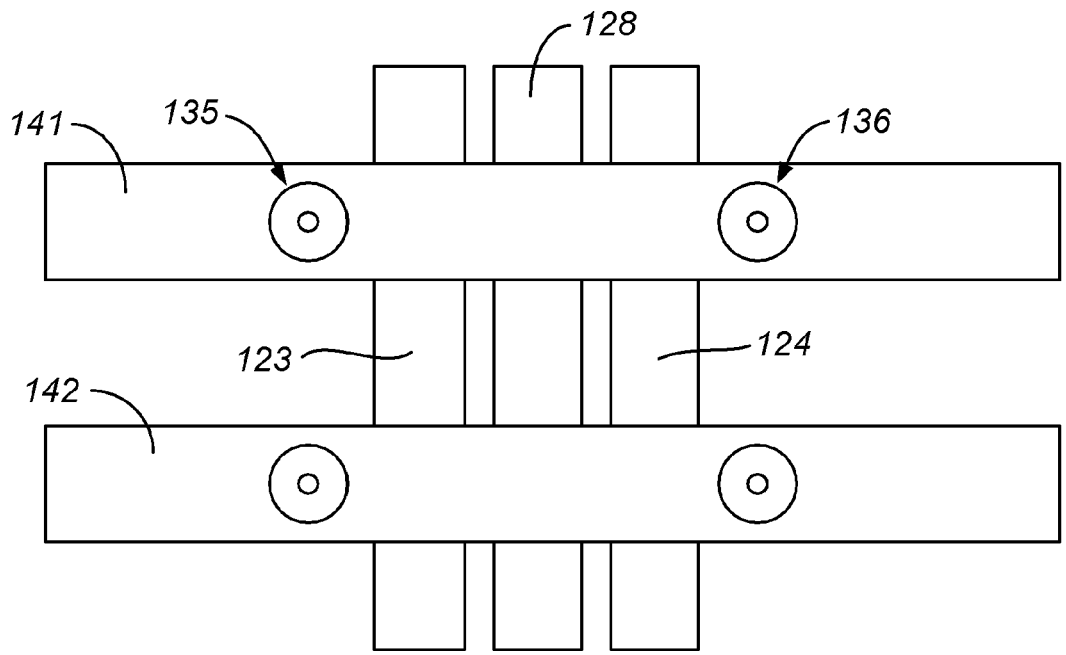
FIG. 13 is a diagrammatic sketch in a layout or plan view showing a part of a memory array having phase change memory elements.

FIG. 13 is a layout or plan view of a memory array as shown in the schematic diagram of FIG. 12, showing the structure above the semiconductor substrate layer 110 of FIG. 11A. Certain of the features are omitted, or are shown as transparent. Word lines 123, 124 are laid out substantially parallel to the source line 28. Metal bit lines 141 and 142 are laid out over, and substantially perpendicular to, the word lines. The positions of memory cell devices 135 below the metal bit lines are indicated, although they would not be visible in this view.

Embodiments of memory cell device 10 include phase change based memory materials, including chalcogenide based materials and other materials, for memory material 14. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, columns 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof. Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse. Further examples of programmable resistive memory materials include GeSbTe, GeSb, NiO, Nb—$SrTiO_3$, Ag—GeTe, PrCaMnO, ZnO, $Nb_2O_5$, Cr—$SrTiO_3$.

For additional information on the manufacture, component materials, use and operation of phase change random access memory devices, see U.S. patent application Ser. No. 11/155, 067, filed 17 Jun. 2005, titled "Thin film fuse phase change RAM and manufacturing method".

Other embodiments are within the scope of the invention.

What is claimed is:

1. A memory device comprising:
   a plurality of memory cells, memory cells in the plurality of memory cells comprising
   a bottom electrode,
   a memory element over the bottom electrode, the memory element having a top surface,
   a dielectric fill over the top surface of the memory element, and
   a top electrode extending through a via in the dielectric fill and including a stem portion, wherein a base of the stem portion of the top electrode is in electrical contact with a contact area on the top surface of the memory element; and
   wherein the vias of the memory cells have via widths adjacent the top surfaces of the memory elements, the via widths having a first variation in magnitude across the plurality of memory cells, and the bases of the stem portions of the top electrodes of the memory cells have base widths less than the via widths, the base widths having a second variation in magnitudes across the plurality of memory cells, the second variation being smaller than the first variation.

2. The device of claim 1 wherein the memory elements of the memory cells comprise an alloy including a chalcogenide.

3. The device of claim 1 wherein the second variation in magnitude of base widths of the stem portion is not dependent on the first variation in magnitude of the via widths.

4. The device of claim 1 wherein the width of the base of the stem portion of respective memory cells is nominally between 20 nm and 50 nm.

5. The device of claim 1, wherein the top electrodes of the memory cells comprise a liner and a core.

6. The memory device of claim 1, wherein the contact areas of the bases of the stem portions have widths less than the widths of the top surfaces of the memory elements.

7. The memory device of claim 1, wherein the bottom electrodes of the memory cells contact bottom surfaces of the memory elements at second contact areas, the second contact areas being larger than the contact areas of the bases of the stem portions of the top electrodes.

8. The device of claim 5, wherein the liner comprises a material chosen from tantalum nitride, titanium nitride, and tungsten nitride.

9. A memory device, comprising:
a substrate;
a first electrode over the substrate;
a memory element in electrical contact with the first electrode, the memory element having a top surface;
a dielectric fill layer over the top surface of the memory element, the first electrode, and the substrate, the dielectric fill layer having a via extending therethrough over the memory element, the via having a perimeter with a width;
an overlying layer over the dielectric fill layer and having an opening therethrough over the via, the opening having a width less than the width of the via such that an overhang of the overlying layer extends inward from the perimeter of the via;
a solid insulating spacer extending beneath the overhang, and within and partially filling the via to provide a contact opening more narrow than the width of the via and more narrow than the opening in the overlying layer; and
a second electrode extending into the contact opening, the second electrode comprising a stem portion, a base of the stem portion having a contact area in electrical contact with the top surface of the memory element;
wherein the contact area has a width dependent upon a width of the overhang.

10. The memory device of claim 9 wherein the width of the contact area is about twice the width of the overhang.

11. The memory device of claim 9 wherein the solid insulating spacer is a thermal isolation material.

12. The memory device of claim 9, wherein the width of the contact area is less than the width of the top surface of the memory element.

* * * * *